United States Patent [19]

Pinkhasov

[11] Patent Number: 4,942,844
[45] Date of Patent: Jul. 24, 1990

[54] HIGH PENETRATION DEPOSITION PROCESS AND APPARATUS

[75] Inventor: Eduard Pinkhasov, Eastchester, N.Y.

[73] Assignee: Vapor Technologies Inc., Mt. Vernon, N.Y.

[21] Appl. No.: 446,928

[22] Filed: Dec. 6, 1989

Related U.S. Application Data

[62] Division of Ser. No. 276,068, Nov. 25, 1988.

[51] Int. Cl.$^5$ ............................................. C23C 14/24
[52] U.S. Cl. .................................... 118/723; 118/715; 118/50.1
[58] Field of Search ....................... 118/715, 723, 50.1

Primary Examiner—Richard Bueker
Attorney, Agent, or Firm—Herbert Dubno

[57] ABSTRACT

A method and apparatus for deep penetration deposition of material in a porous substrate utilizes a pressure differential across the substrate to effect penetration of arc-produced vapor from one chamber through the body. The one chamber can be held at a pressure of $10^{-2}$ to $10^{-3}$ torr while the other chamber is at a pressure of $10^{-5}$ to $10^{-6}$ torr.

6 Claims, 1 Drawing Sheet

HIGH PENETRATION DEPOSITION PROCESS AND APPARATUS

CROSS REFERENCE TO RELATED APPLICATIONS

This is a divisional of co-pending application 07/276,068 filed on 25 Nov. 1988. This application is related to my copending application Ser. No. 06/941,185 filed 12 December 1986 and to subject matter disclosed in earlier applications linked to this copending application and have matured into U.S. Pat. Nos.: 4,351,855, 4,438,153, 4,505,948, 4,537,794, 4,548,670 4,565,711 4,569,307 4,575,401.

In addition, reference may be had to my copending application Ser. No. 07/208,886 filed 17 June 1988.

FIELD OF THE INVENTION

My present invention relates to a method of and an apparatus for effecting deposition of a material into interstices of a fully or partially porous body, to the production of a high-density structure utilizing such deposition of material, to apparatus for carrying out the method and to a method of and an apparatus for effecting the plugging of cracks, fissures or pores in a pipe or similar element.

BACKGROUND OF THE INVENTION

The aforementioned copending applications and patents are concerned with low-temperature deposition processes, and apparatus for carrying out the processes, whereby the deposited material can be derived by striking an arc between electrodes in an evacuated space at relatively high currents and low voltages to vaporize a substance from one of these electrodes.

That substance may, in turn, be deposited upon a surface or that substance may react with other elements or substances present in the remaining atmosphere within the evacuated chamber, or with substances from the other electrode or from other electrodes to produce compounds, such as ceramics, which can be deposited upon substrates.

Frequently, however, it is desirable to obtain penetration of deposited materials significantly into the depth of a porous body or, in an appropriate case, to fill the pores or interstices of a body with a deposited material.

A specific case in which depositing a material in deep intersticial spaces is of advantage, is the plugging of a pipe in which the interstices may be cracks, macropores, microporous structures or the like.

Naturally, even prior to the arc vapor deposition techniques disclosed in the earlier applications and patents, there were attempts to deposit materials of a considerable depth within a substrate. For example, attempts have been made to utilize chemical vapor deposition or electroless or chemical plating techniques for this purpose and even to use electrodeposition techniques.

By and large these techniques have failed partly because deposits form rapidly on the regions closest to the source of the deposited material and prevent further penetration of the material. Most earlier techniques, moreover, are incapable of substantially completely filling the pores of porous bodies or structures and have not proved to be satisfactory for that reason.

OBJECTS OF THE INVENTION

The principal object of the present invention is to provide a deep-penetration deposition method whereby materials can be deposited to relatively great depths in a porous structure without the drawbacks of earlier systems, even to the point that high-density articles can be fabricated.

It is another object of this invention to provide an improved method of making high-density materials utilizing a deposition approach.

Yet another object of this invention is to provide a method of sealing cracks, pores or interstices in a pipe.

It is also an object of the present invention to provide an improved method of making metal matrix materials.

Still another object of my invention is to provide an improved apparatus for carrying out the methods of the invention.

SUMMARY OF THE INVENTION

These objects and others which will become apparent hereinafter are attained, in accordance with the present invention by a method which involves the application of a force gradient across a porous body between a subatmospheric first chamber and a subatmospheric second chamber, thereby inducing penetration of material formed in the first chamber through the body toward the second chamber, the material in the first chamber being generated preferably by arc vapor deposition.

More particularly, I can produce a high-density structure in a product by providing a porous body and disposing it between two chambers while evacuating the first chamber to a reduced pressure sufficient to enable an arc discharge to be created to generate vapor of a substance to be deposited as part of the material which is driven into the body by the pressure differential applied thereacross.

The method of the invention for producing a high-density structure can thus comprise the steps of:

(a) disposing a body of a porous material between two chambers;

(b) evacuating one of the chambers to a subatmospheric pressure adapted to sustain vapor formation by an electrical discharge;

(c) effecting an electrical discharge in the one of the chambers to vaporize a substance therein; and (d) evacuating the other of t he chambers to a lower subatmospheric pressure and a higher vacuum than that in the one of the chambers and thereby inducing the substance to penetrate into the body and deposit in interstices thereof in the form of a deposited material.

The substance can be vaporized from an electrode in the one or first chamber by striking an arc between these electrodes and a counterelectrode, e.g. by moving the electrodes into contact and apart as described in the aforementioned copending applications and patents, while a voltage of, for example 20 to 150 volts, is applied across the electrodes so that the arc, when it is struck, will have an arc current of 40 to 150 amperes.

According to a feature of the invention, a pressure of about $10^{-2}$ to $10^{-3}$ torr is maintained in the first chamber while the pressure in the second chamber is maintained at $10^{-5}$ to $10^{-6}$ torr.

Surprisingly, under these conditions the material vaporized in the first chamber appears to be deposited in the porous body to practically completely fill the pores thereof so that especially high-density products can be made.

The porous body can be a metal matrix, which can be formed by metal filaments or fibers forming a nonwoven fabric. Preferably, however, I prefer to fill the interstices of a body of the type made by the method described in my copending application Ser. No. 07/208,886 before or after compaction of this material. That material can be formed in turn by utilizing the arc vapor deposition method of the invention to coat the walls of the open pore or reticulate structure of a synthetic resin foam whereupon the coated product can be pyrolyzed to leave an openwork which can be filled by application of a pressure differential across the body in the manner described.

It is possible, in accordance with the invention, to form the first chamber within the interior of a pipe which can constitute the body whose pores are to be filled. The pipe, in turn, can be surrounded by an enclosure defining the second chamber downwardly of the pipe wall and with other means closing the ends of the pipe. The first chamber is then defined within the interior of the pipe.

In practice, this approach can be used for the deposition of materials, including ceramics, within interstices discovered in a pipe wall so as to plug those interstices.

Other porous bodies or substrates can be used with equal advantage. For example, if one wishes, the porous body can be constituted as a fabric or nonwoven fiber structure. Alternatively, the body can be a synthetic resin foam which is not destroyed. It can also be constituted as a cloth.

According to a feature of the invention, an apparatus for carrying out the process can comprise:

means defining two chambers on opposite sides of the body;

means for evacuating one of the chambers to a subatmospheric pressure adapted to sustain vapor formation by an electrical discharge;

means for effecting an electrical discharge in the one of the chambers to vaporize a substance therein; and means for evacuating the other of the chambers to a lower subatmospheric pressure and a higher vacuum than that in the one of the chambers and thereby inducing the substance to penetrate into the body and deposit in interstices thereof in the form of a deposited material.

The material which is deposited can be a metal identical with a metal vaporized from one of the electrodes. Alternatively, the substance which is vaporized from the electrode can be a compound or alloy corresponding to the composition of the electrode.

In another system within the present invention, the deposited material is formed in situ within the first chamber by reaction of a component admitted to the chamber with the substance vaporized from the electrode.

The apparatus can have parts flanged together to position the workpiece between the two chambers and for a flange connection of respective pumps to the chambers for evacuating them to the desired levels.

An electrode rod can extend through the pipe which is to be plugged, in accordance with the invention, so that wide-area coating techniques as described in my earlier patents can be applied in a convenient manner.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
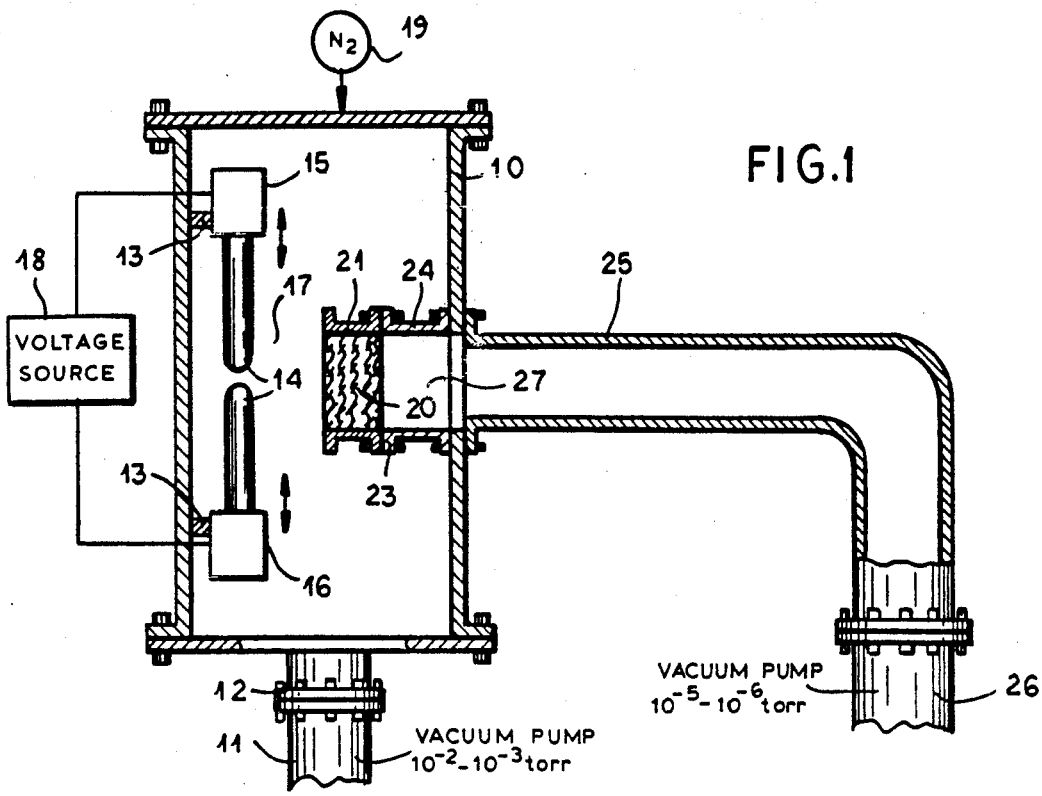
FIG. 1 is a side elevational view, partly in cross section, of an apparatus for carrying out the method of the present invention in the filling of a porous body.

In FIG. 1 I have shown a chamber 10 which can evacuated to a subatmospheric pressure of $10^{-2}$ to $10^{-3}$ torr by a vacuum pump 11 connected by a flange coupling 12 to the vacuum chamber 10. Within the vacuum chamber I provide a support 13 for a pair of electrodes 14 at least one of which is composed of a substance which is to be present in material to be deposited.

The electrodes can be reciprocated as described in my earlier applications and patents by a mechanism 15 or 16 so that an arc can be struck between the electrodes to vaporize the substance in a space 17 under the pressure maintained within chamber 10. A voltage source 18 is connected across the electrodes so that the arc is struck at a potential of 20 to 150 volts and can have an arc discharge current of say 40 to 150 amperes.

The chamber 10 can communicate with a nitrogen source 19 representing a source of any gaseous component which can chemically combine with the vaporizable substance to permit the deposition of a compound or alloy in the porous body 20 to be penetrated by the deposited material.

The porous body 20, which can be a metal matrix, a nonwoven fiber mass of metal or synthetic resin or even natural-fiber filaments, a cloth pad sintered metal body or even a plated glass structure, can be held in a holder 21 connected to the space 17 by a flange coupling 22 and by a coupling 23 to a pipe 24 communicating via a further pipe 25 with a vacuum pump 26 adapted to generate a subatmospheric pressure of say $10^{-5}$ to $10^{-6}$ torr.

The space 17 on one side of the porous body 20 is thus at a subatmospheric pressure which is low enough to sustain an effective arc discharge to produce a vapor of a substance of one of the electrodes but which is higher than the pressure in a chamber 27 at the opposite side of the porous body.

The vapor when it is formed and any compound which it may form as described, has been found to penetrate the body under a force gradient which results from the pressure differential across the body and, surprisingly, results in a filling of the interstices with the material which is thus deposited.

For example, I may fabricate a metal matrix utilizing the principles described in my application Ser. No. 07/208,886, e.g. of nickel, and then fill the interstices thereof utilizing the apparatus of FIG. 1 with, for example, titanium nitride by utilizing titanium for the electrodes and admitting nitrogen to the chamber 10 and the space 17. A ceramic-filled nickel metal matrix thus can result.

When one of the electrodes is composed of tungsten or silicon, for example, the other electrode can be composed of carbon so that silicon carbide can form and deposit in the metal matrix.

Instead of a metal matrix, of course, I may use a foam, e.g. of the type used to make the metal matrix in Ser. No. 07/208,886 and substantially fill the interstices thereof with the metal or metal alloy or a metal compound.

SPECIFIC EXAMPLE

A nickel openwork structure adapted to constitute a metal matrix is made by subjecting an 80-pores-per-inch open-pore flexible reticulated ester, polyurethane foam of a density of about 1.75 pounds per cubic foot and a thickness of approximately 1/16th of an inch to low temperature arc vapor deposition in a vacuum chamber to which a vacuum of $10^{-5}$ torr has been applied using nickel electrodes between which the arc is struck. The applied voltage is 40 volts and an arc current of about 75 amperes is drawn. The process is carried out until the substrate is coated to the full thickness thereof.

The metal-coated polyurthane foam, coated with approximately 50 grams of nickel per square foot is subjected to pyrolysis in the presence of air in an electric furnace for 2 minutes at 350°C. to completely eliminate the polyurethane structure. The substrate is then subjected to sintering in a vacuum furnace at 950°C. to 1250°C., preferably about 1100°C. for a period of 5 to 60 minutes, preferably about 15 minutes. The nickel structure has up to 95% porosity.

A stack of substrates as thus made, forming a body with a total thickness of one inch, is impregnated with titanium nitride by the use of the apparatus of FIG. 1. In that apparatus, the electrodes are composed of titanium and the arc discharge is effected by striking an arc between the electrodes. The voltage across the electrodes is about 50 volts and the arc current is about 75 amperes. A vacuum of $10^{-3}$ torr is maintained in chamber 17 and a vacuum of $10^{-5}$ torr is maintained in chamber 27.

Nitrogen is admitted to the chamber 17 and titanium nitride is deposited in the interstices in the stack of substrate under the pressure differential thereacross. Upon weighing the porous body after 20 to 30 minutes, it is found that the pores of the porous body have been practically completely filled with titanium nitride, imparting a dense structure to the body.

Figure 2:
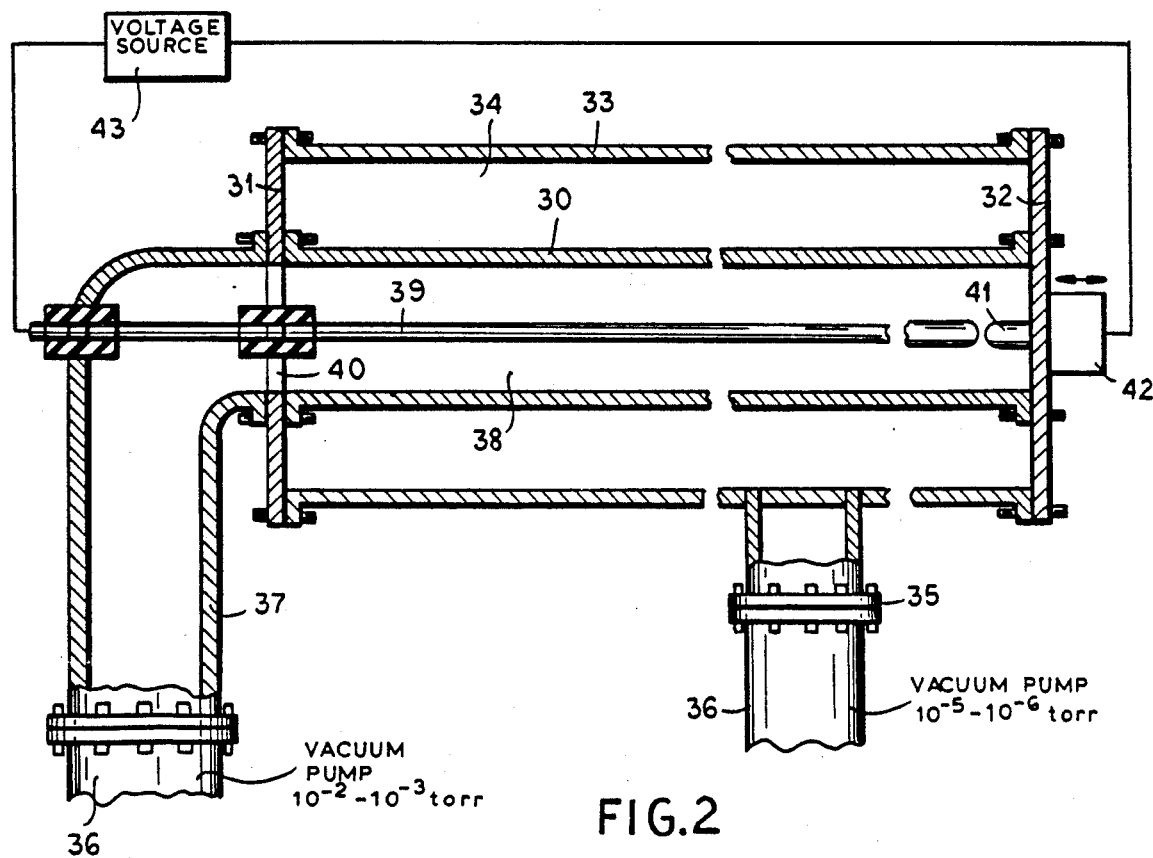
FIG. 2 is a similar section of an apparatus for plugging holes in a pipe by the method of the invention.

In FIG. 2 I have shown how the principles of the invention can be applied to the plugging of pores in a porous pipe 30. The pores in this pipe can be intentionally left therein if it is desired to have the pores filled with a ceramic material such as chromium nitride or titanium nitride. The pores may also be a result of cracks generated in the formation of the pipe or in the use thereof. The cracks can be filled with chromium, titanium, nickel or alloys thereof or ceramics.

The pipe 30 is mounted between plates 31 and 32 to which the pipe is flanged and which support, in addition, an outer cylindrical member 33 defining an outer chamber 34 to which flange connection 35 can connect a vacuum pump 36 adapted to generate a suction of $10^{-5}$ to $10^{-6}$ torr in the chamber 34.

Another vacuum pump 36 is connected by a pipe 37 and corresponding flange connections to the chamber 38 formed on the interior of the pipe 30.

An electrode 39 is mounted in the pipe 37 and by a spider 40 on the plate 31 so as to extend centrally within the pipe 30.

A counter electrode 41 is mounted on the plate 32 and can be moved toward and away from the electrode 39 to strike an arc therewith. The mechanism 42 for displacing the electrode 41 to strike the arc is mounted on the plate 32. The voltage source 43 is connected across the electrodes.

Essentially, the apparatus shown in FIG. 2 operates in accordance with the same principles as the apparatus of FIG. 1. A driving force is created across the wall of the pipe 30 by the pressure differential between the chambers 38 and 34 because of the differential evacuation of these chambers by the respective pumps. When an arc is struck, the discharge travels along the electrode 39 vaporizing material therefrom, e.g. nickel or chromium, to permit this material to penetrate through interstices or pores, holes or micropores in the pipe wall. The penetration of the deposited material is to the full thickness of the pipe wall and the deposited material can plug the cracks or pores in the latter.

I claim:

1. An apparatus for effecting filling of interstices of a body with a deposited material, comprising:
   means defining two chambers on opposite sides of said body;
   means for evacuating one of said chambers to a subatmospheric pressure adapted to sustain vapor formation by an electrical discharge;
   means for effecting an electrical discharge in said one of said chambers to vaporize a substance therein; and
   means for evacuating the other of said chambers to a lower subatmospheric pressure and a higher vacuum than that in said one of said chambers and thereby inducing said substance to penetrate into said body and deposit in interstices thereof in the form of a deposited material.

2. The apparatus defined in claim 1 wherein said means for effecting an electrical discharge in said one of said chambers includes means for striking an electric arc between an electrode composed of said material and a counterelectrode.

3. The apparatus defined in claim 2 wherein said counterelectrode is composed of a material reacting with said substance to form a ceramic as said deposited material.

4. The apparatus defined in claim 2 wherein said one of said chambers is provided with means for admitting a gas thereto for reaction with said substance to form a ceramic as said deposited material.

5. The apparatus defined in claim 2 wherein said means for evacuating one of said chambers is a vacuum pump adapted to generate a vacuum of $10^{-2}$ to $10^{-3}$ torr in said one of said chambers and said means for evacuating the other of said chambers is a vacuum pump adapted to generate a vacuum of $10^{-5}$ to $10^{-6}$ torr in said other of said chambers.

6. The apparatus defined in claim 2 wherein said body is a pipe, said one of said chambers is formed within said pipe and said other chamber surrounds said pipe, said electrode extending longitudinally within said pipe.

* * * * *